US009030254B2

(12) United States Patent
Mouchon et al.

(10) Patent No.: US 9,030,254 B2
(45) Date of Patent: May 12, 2015

(54) RF CHANNEL AMPLIFICATION MODULE WITH INSTANTANEOUS POWER LIMITING FUNCTION

(71) Applicant: THALES, Neuilly-sur-Seine (FR)

(72) Inventors: Gregory Mouchon, Muret (FR); Jean Maynard, Ramonville Saint Agne (FR); David Lopez, Toulouse (FR); Jean-Francois Villemazet, Cintegabelle (FR)

(73) Assignee: THALES, Courbevoie (FR)

( * ) Notice: Subject to any disclaimer, the term of this patent is extended or adjusted under 35 U.S.C. 154(b) by 62 days.

(21) Appl. No.: 14/064,044

(22) Filed: Oct. 25, 2013

(65) Prior Publication Data
US 2014/0118062 A1    May 1, 2014

(30) Foreign Application Priority Data

Oct. 26, 2012    (FR) .................................... 12 02862

(51) Int. Cl.
| | |
|---|---|
| *H03F 1/32* | (2006.01) |
| *H03F 3/58* | (2006.01) |
| *H03G 3/30* | (2006.01) |
| *H03F 3/189* | (2006.01) |

(52) U.S. Cl.
CPC ................ *H03F 1/3241* (2013.01); *H03F 3/58* (2013.01); *H03G 3/3042* (2013.01); *H03F 3/189* (2013.01)

(58) Field of Classification Search
USPC .................... 330/43, 149, 302; 375/296–297; 455/114.3
See application file for complete search history.

(56) References Cited

U.S. PATENT DOCUMENTS

| | | | |
|---|---|---|---|
| 4,701,717 A | 10/1987 | Radermacher et al. | |
| 6,188,279 B1 | 2/2001 | Yuen et al. | |
| 6,255,908 B1 * | 7/2001 | Ghannouchi et al. | 330/149 |
| 6,781,454 B1 | 8/2004 | Kirkman | |

\* cited by examiner

*Primary Examiner* — Hieu Nguyen
(74) *Attorney, Agent, or Firm* — Baker Hostetler LLP

(57) ABSTRACT

A radio frequency channel amplification module for communication satellite, comprises an input configured to convey an input radio frequency signal, an output configured to restore a pre-amplified output radio frequency signal intended to power a travelling wave tube amplifier that can be equipped with linearization means with predistortion, at least one first upstream gain control module arranged downstream of the input and one second downstream gain control module arranged downstream of the first upstream gain control module and upstream of any linearization means by predistortion. The channel amplification module also comprises an instantaneous power limiter intended to clip the peaks of the input radio frequency signals with a level exceeding a determined threshold value, the instantaneous power limiter being arranged in series between said first upstream gain control module and said second downstream gain control module.

7 Claims, 2 Drawing Sheets

RF CHANNEL AMPLIFICATION MODULE WITH INSTANTANEOUS POWER LIMITING FUNCTION

CROSS-REFERENCE TO RELATED APPLICATION

This application claims priority to foreign French patent application No. FR 1202862, filed on Oct. 26, 2012, the disclosure of which is incorporated by reference in its entirety.

FIELD OF THE INVENTION

The present invention relates to a radio frequency channel amplification module with instantaneous power limiting function. It applies particularly to the field of communication satellites, and more specifically to the pre-amplification of the input signals of the radio frequency power amplifiers of travelling wave tube type equipped or not with linearization means by predistortion.

BACKGROUND

In telecommunication satellites, it is necessary to amplify radio frequency signals received in order to retransmit them, via transmit antennas, to subscribers, that is to say receiving stations, for example situated on the ground or in airborne carriers. The devices embedded in the satellites making it possible to retransmit the radio frequency signals are commonly called "repeaters". A repeater comprises communication subsystems or channels and each communication subsystem can typically comprise, in its output section or "downlink channel", one or more travelling wave tube amplifiers, linearized or not, commonly designated (L)TWTA, which stands for "(linearized) travelling wave tube amplifier", the travelling wave tubes commonly being referred to by their acronym TWT. For optimum performance, a TWT is usually used close to its saturation region, and constitutes an equipment item that is particularly sensitive to input levels above its saturation power. Excessively high input levels can in fact result in deterioration, even destruction, of the TWT. An application of input levels above an acceptable threshold is commonly referred to by the term "overdrive".

According to known techniques, an amplification module of channel amplifier type can be arranged upstream of the LTWTA, making it possible to condition the radio frequency signal applied as input to the TWT, notably via a pre-amplification. Known channel amplifiers are, for example, called CAMP, which stands for "Channel AMPlifier", or even "DLA", which stands for "Driver Limiter Amplifier". Typically, a linearized travelling wave tube amplifier LTWTA benefits from an output power limiting function that makes it possible to protect the TWT when the levels of the input signals are too high. This function is, as is known, handled by a limiter situated upstream of the TWT and downstream of the predistortion means used for the linearization of the TWT, and based on a technology of MMIC type, MMIC standing for "Monolithic Microwave Integrated Circuit", based on a material of semiconductor type, for example gallium arsenide AsGa. Such a solution, well known and described notably in the document U.S. Pat. No. 4,701,717, does, however, present two major drawbacks, explained hereinbelow.

The first drawback is linked to the robustness of the technology employed, which cannot be engaged over indeterminate overdrive periods. The engagement in terms of duration is limited, and depends on the overdrive level considered, and on the knowledge acquired by experiencing real conditions. Fatigue tests, or life tests, can be carried out, but the engagement in terms of duration must necessarily be bounded by the duration of the life test, since there is no accelerated ageing process currently in existence.

The second drawback is linked to the fact that the gain control of the channel amplifier is all carried out upstream of the limiter, which means that all of the communication subsystem of the repeater can only be protected when the TWT is operated close to saturation. In practice, operating the TWT with a small signal is generally done by reducing the gain of the channel amplifier situated upstream of the LTWTA. In this case, the output limiter is operated in its linear region and no longer close to its saturation. It is therefore no longer able to clip the peaks of the interfering signals, whether deliberate or not, this phenomenon being able to create a significant degradation of the link budget and therefore of the system performance levels.

Another known limiting solution consists in using a power regulation loop with threshold as described in the document U.S. Pat. No. 4,701,717, but this solution exhibits an excessively long response time that is incompatible with the filtering of pulsed signals originating from a scrambler or from an overdrive of a duration less than this response time.

Thus, there is at this time no known solution that makes it possible to protect a linearized travelling wave tube whatever its operating point, of strong back-off or at saturation, in the case of a scrambler or permanent overdrive, whether it is continuous or pulsed. It is therefore not possible to ensure a minimum service level, that is to say satisfy minimum communication requirements, in the case of the presence of a scrambler or permanent overdrive.

SUMMARY OF THE INVENTION

One aim of the present invention is to mitigate at least the abovementioned drawbacks, by proposing a physical solution that makes it possible to protect the TWT from high level input signals, transient or continuous, and that provides a withstand strength in overdrive conditions for a duration corresponding at least to the life of the satellite. The solution proposed by the present invention entails introducing an instantaneous limiter arranged shrewdly in the radio frequency channel amplification module situated upstream of the TWTA or of the LTWTA, in order to procure effective protection for the TWT and optimize the performance levels of the communication system in the presence of a scrambler or an overdrive, regardless of the operating point selected for the TWT (at saturation or in back-off mode). According to the invention, the instantaneous limiter, called "hard" limiter, is connected in series between two elements with variable gain, for example of variable gain amplifier type or assembly of variable gain amplifier and variable attenuator connected in series. Positioned thus upstream of any linearizer and therefore upstream of the TWT predistortion means, the limiter makes it possible to provide sufficient limiting performance levels regardless of the operator point, at saturation or in back-off mode, of the LTWTA, which is not made possible by the known solutions having a limiter at the output of the predistortion means. The element with variable gain situated upstream of the instantaneous limiter makes it possible to provide limiting performance regardless of the input power of the radio frequency amplification module.

One advantage of the invention is that it also allows, by adjustment, for an improved adaptability of the severity of the power limiting, according to the specific requirements of the missions.

To this end, the subject of the invention is a radio frequency channel amplification module for communication satellite, comprising an input configured to convey an input radio frequency signal, an output configured to restore a pre-amplified output radio frequency signal intended to power a travelling wave tube amplifier that can be equipped with linearization means by predistortion, at least one first upstream gain control module arranged downstream of the input and one second downstream gain control module arranged downstream of the first upstream gain control module and upstream of any linearization means by predistortion. The channel amplification module also comprises an instantaneous power limiter intended to clip the peaks of the input radio frequency signals with a level exceeding a determined threshold value, the instantaneous power limiter being arranged in series between said first upstream gain control module and said second downstream gain control module.

In one embodiment of the invention, the instantaneous power limiter can be formed by a diode limiter.

In one embodiment of the invention, said determined threshold value can be a predetermined value.

In one embodiment of the invention, the channel amplification module can also comprise adjustment means making it possible to adjust said determined threshold value.

In one embodiment of the invention, the channel amplification module can also comprise a linearizer by predistortion linked to said downstream gain control module.

In one embodiment of the invention, the channel amplification module can also comprise a second power limiter arranged downstream of the linearizer.

Also the subject of the present invention is a repeater for communication satellite comprising at least one travelling wave tube amplifier and one channel amplification module according to one of the embodiments described, the output of which drives the input of the travelling wave tube amplifier.

BRIEF DESCRIPTION OF THE DRAWINGS

Other features and advantages of the invention will become apparent on reading the description, given as an example, in light of the appended drawings which represent.

DETAILED DESCRIPTION

Figure 1:
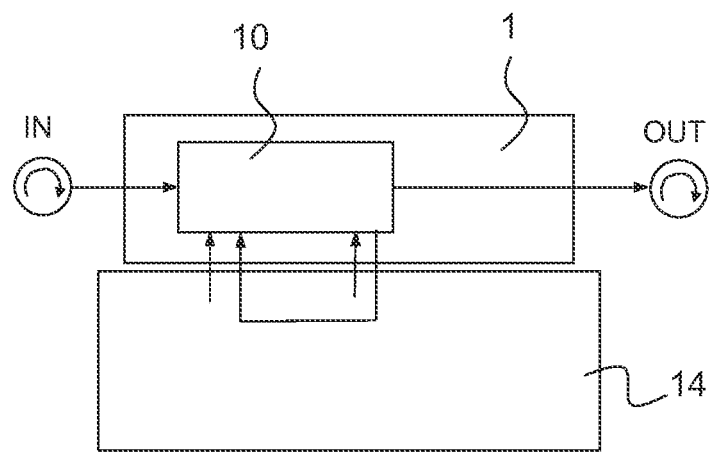
FIG. 1: a diagram illustrating by block diagram a radio frequency channel amplifier which is known per se from the prior art.

Referring to FIG. 1, a radio frequency channel amplifier 1 can typically comprise an amplification module 10, the input of which has an input radio frequency signal IN applied to it and the output of which restores an amplified output radio frequency signal OUT. The radio frequency channel amplifier 1 can comprise a control module 14 generating control signals intended for the amplification module 10, more specifically gain control signals intended for a plurality of attenuators and low-level amplifiers, arranged cascade-fashion, as is described hereinbelow with reference to an example illustrated by FIG. 2. Control signals can be generated as a function of different parameters, such as, for example, signal levels, temperature, quantified by detectors that can be included in the amplification module 10. In practice, the elements that make up the control module 14 can also be incorporated in an electronic power conditioner, commonly referred to by its acronym EPC, also associated with a TWT, not represented in the figure, the input of which is driven by the output signal OUT.

Figure 2:
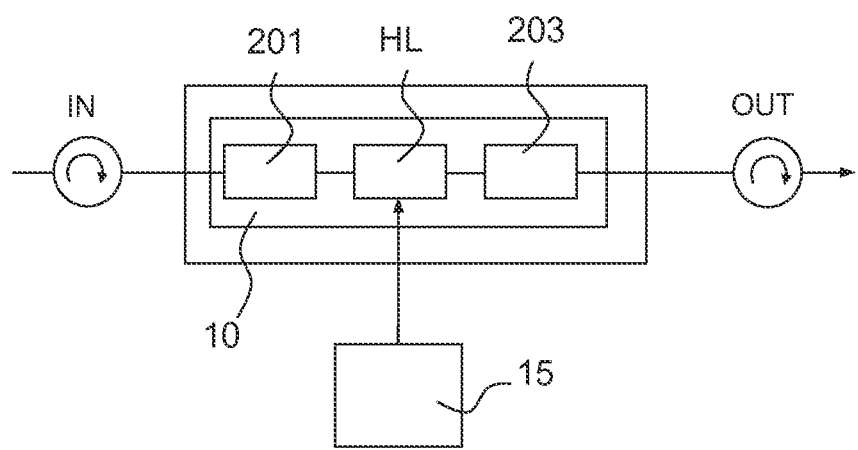
FIG. 2: a diagram illustrating a radio frequency channel amplification module with power limiting function, according to one embodiment of the invention.

Referring to FIG. 2, the amplification module 10 of the radio frequency channel amplifier 1 as described previously with reference to FIG. 1, can comprise an upstream gain control module 201, the upstream gain control module 201 comprising elements with variable gain, for example a plurality of flow control attenuators, commonly referred to by their acronym FCA, and a plurality of amplifiers, for example low-level amplifiers, commonly referred to by their acronym LLA, arranged cascade-fashion. According to a specific feature of the present invention, an instantaneous power limiter HL is arranged downstream of the upstream gain control module 201, and upstream of a downstream gain control module 203. The downstream gain control module 203 can comprise elements with variable gain, for example a plurality of amplifiers and attenuators arranged cascade-fashion, like the upstream gain control module 201 described above.

The exemplary structure of the amplification module 10 illustrated by FIG. 2 is in no way limiting on the present invention. Generically, it is proposed, according to the present invention, that the amplification module 10 comprise:
at least one upstream gain control module 201 and at least one downstream gain control module 203,
an instantaneous power limiter HL arranged between the upstream gain control module 201 and the downstream gain control module 203, according to a specific feature of the present invention.

The amplification module 10 is placed upstream of a travelling wave tube TWT 13 equipped or not with linearization means 11 including a predistortion means, the linearization means 11 also being able to include a second power limiter, not represented, making it possible to limit the power of the input of the TWT. The instantaneous power limiter HL can be based on a robust technology suited to permanent overdrive mode withstand strength, and can, for example, be formed by a diode limiter. The power limiter HL makes it possible to clip the peaks of the signals with a level exceeding a determined threshold value.

The determined threshold value can, for example, be a predetermined threshold value, or advantageously, adjustment means 15 can enable a user to adapt the threshold value.

The power limiting function handled by the instantaneous power limiter HL makes it possible to limit the input power of the TWT, linearized or not, in the case of permanent overdrive, over the entire input power range of the radio frequency channel amplification module 10, as is described below with reference to FIG. 3.

Figure 3:
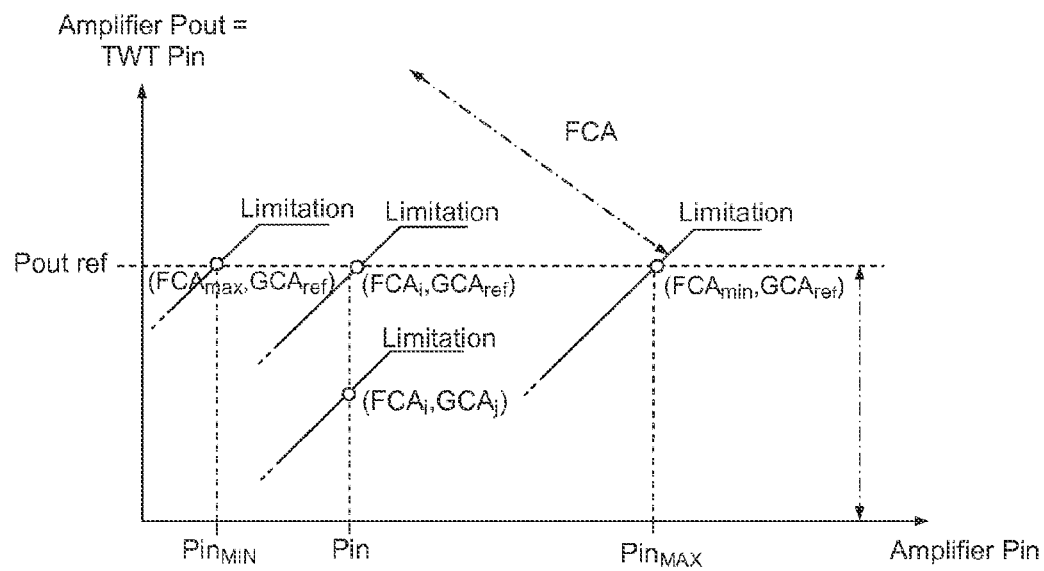
FIG. 3: curves illustrating the output level of a channel amplification module, as a function of the input level, according to one embodiment of the invention.

FIG. 3 is a graphic representation illustrating the output level of a channel amplification module including an instantaneous power limiter, according to one embodiment of the invention, as a function of the input level. The x-axis bears power values Pin of the input radio frequency signal IN. The y-axis bears power values Pout of the output radio frequency signal OUT, that is to say values of the input power of the signal applied at the input of the TWT, linearized or not, intended to be arranged downstream of the radio frequency channel amplification module 10. In FIG. 3, a reference downstream gain value GCAref corresponds to the configuration of the downstream gain GCA that makes it possible to saturate the TWT for any upstream gain FCA/input power Pin pairing saturating the TWT. The instantaneous power limiter HL being positioned between the upstream gain and downstream gain functions, as was described previously with reference to FIG. 2, the power limiting function is available for any downstream gain GCAj and therefore any point of operation of the TWT (for a power level at the input of the instantaneous power limit HL that is constant).

It should be noted that another advantage of the present invention is linked to the fact that the particular arrangement of the instantaneous power limiter HL makes it possible to adapt the severity of the power limiting according to the specific features of the missions envisaged. For example, if the mission requires the limiting to be severe, it is possible to increase the gain upstream of the instantaneous power limiter HL, that is to say the gain of the first gain control module 201, with reference to FIG. 2 described previously, while reducing the gain of the second gain control module 203. Similarly, if the mission requires, on the other hand, a less severe limiting, it is possible to increase the gain of the second gain control module 203, so as to drive the instantaneous power limiter HL more in back-off mode, that is to say to operate the limiter in a more linear operating region, thus reducing the limiting performance, with a lesser gain with regard to the first gain control module 201.

Figure 4:
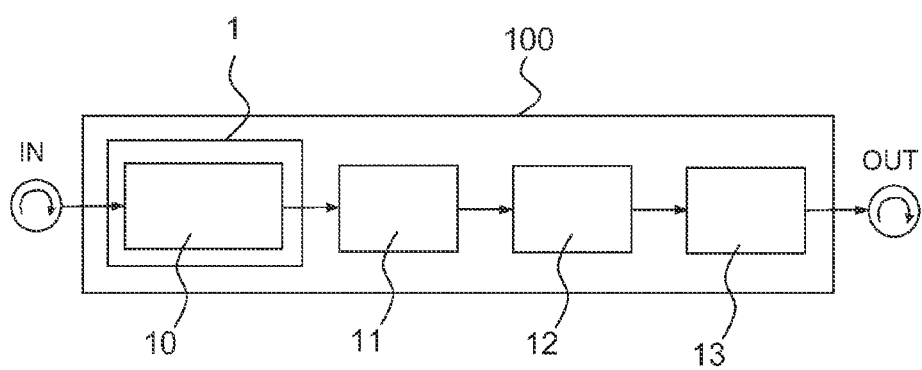
FIG. 4: a diagram illustrating a communication channel of a satellite repeater comprising an amplification module according to the invention.

FIG. 4 illustrates the position of the channel amplification module 10 in a communication channel of a satellite repeater 100. The amplification module 10 equipped with the instantaneous power limiter HL is placed upstream of a travelling wave tube power amplifier 13. The travelling wave tube amplifier can optionally comprise linearization means by predistortion 11 and a second power limiter 12 arranged between the amplification module 10 and the travelling wave amplifier 13, the second power limiter 12 being arranged downstream of the linearizer (11).

A channel amplification module 10 according to any one of the embodiments of the invention described above, can be applied equally to signals in the Ka band (that is, for frequencies of the received signals typically between 17 and 23 GHz), or even in the C band (from 3.4 GHz to 4.2 GHz) and Ku band (from 10.7 GHz to 12.75 GHz) and any other frequency band (L, S, Q, etc.).

The invention claimed is:

1. A radio frequency channel amplification module for communication satellite repeater, comprising:
    an input configured to convey an input radio frequency signal,
    an output configured to restore a pre-amplified output radio frequency signal intended to power a travelling wave tube amplifier that can be equipped with linearization means by predistortion,
    at least one first upstream gain control module arranged downstream of the input and one second downstream gain control module arranged downstream of the first upstream gain control module and upstream of any linearization means by predistortion, and
    an instantaneous power limiter intended to clip any peaks of the input radio frequency signals with a level exceeding a determined threshold value, the instantaneous power limiter being arranged in series between said first upstream gain control module and said second downstream gain control module.

2. The channel amplification module of claim 1, wherein the instantaneous power limiter is a diode limiter.

3. The channel amplification module of claim 1, wherein said determined threshold value is a predetermined value.

4. The channel amplification module of claim 1, further comprising adjustment means to adjust said determined threshold value.

5. The channel amplification module according to claim 1, further comprising a linearizer by predistortion linked to said downstream gain control module.

6. The channel amplification module of claim 5, further comprising a second power limiter arranged downstream of the linearizer.

7. A repeater for communication satellite comprising at least one travelling wave tube amplifier and a channel amplification module of claim 1, wherein the output of said channel amplification module drives the input of the travelling wave tube amplifier.

* * * * *